United States Patent
Kalpakjian

[19]

[11] Patent Number: 5,808,500
[45] Date of Patent: Sep. 15, 1998

[54] BLOCK ARCHITECTURE SEMICONDUCTOR MEMORY ARRAY UTILIZING NON-INVERTING PASS GATE LOCAL WORDLINE DRIVER

[75] Inventor: Kent M. Kalpakjian, Mountain View, Calif.

[73] Assignee: Cypress Semiconductor Corporation, San Jose, Calif.

[21] Appl. No.: 672,757

[22] Filed: Jun. 28, 1996

[51] Int. Cl.$^6$ .................................................. G11C 7/00
[52] U.S. Cl. ..................................... 327/321; 365/230.06
[58] Field of Search ....................... 365/230.06, 230.03, 365/189.06; 327/427, 431, 434, 437, 440, 581, 309, 321

[56] References Cited

U.S. PATENT DOCUMENTS

| | | | |
|---|---|---|---|
| 4,394,657 | 7/1983 | Isogai et al. ...................... 340/825.93 |
| 4,419,741 | 12/1983 | Stewart et al. .......................... 365/72 |
| 4,429,374 | 1/1984 | Tanimura .............................. 365/230 |
| 4,567,385 | 1/1986 | Falater et al. ......................... 326/86 |
| 4,618,784 | 10/1986 | Chappell et al. ..................... 326/101 |
| 4,642,798 | 2/1987 | Rao ...................................... 365/230 |
| 4,667,337 | 5/1987 | Fletcher ................................. 377/41 |
| 4,678,941 | 7/1987 | Chao et al. ........................... 326/107 |
| 4,843,261 | 6/1989 | Chappell et al. ..................... 326/108 |
| 5,015,881 | 5/1991 | Chappell et al. ..................... 326/108 |
| 5,311,479 | 5/1994 | Harada ............................. 365/230.06 |
| 5,347,493 | 9/1994 | Pascucci ............................ 365/230.05 |
| 5,376,915 | 12/1994 | Takeuchi et al. .................... 340/146.2 |
| 5,410,268 | 4/1995 | Sharpe-Geisler ........................ 327/51 |
| 5,469,385 | 11/1995 | Smith et al. ....................... 365/189.05 |
| 5,583,816 | 12/1996 | McClure ........................... 365/230.06 |
| 5,598,365 | 1/1997 | Shoji .................................. 365/230.06 |

*Primary Examiner*—Timothy P. Callahan
*Assistant Examiner*—My-Trang Nu Ton
*Attorney, Agent, or Firm*—Oblon, Spivak, McClelland, Maier & Neustadt, P.C.

[57] ABSTRACT

A non-inverting pass gate local wordline scheme for block architecture memory arrays is described which includes two switches connected in parallel which may be driven by complementary control signals. A clamping switch may be connected to the local wordline to clamp the local wordline to a power supply voltage at a low logic level whenever the pass gate blocks an input signal. When a particle or defect creates a short which short circuits a local wordline to a global wordline, the global wordline may be permanently disabled by pulling it LOW. Regardless of the states and/or polarities of the BLOCK and $\overline{\text{BLOCK}}$ signals, the local wordline is permanently held LOW because the pass gate is non-inverting. The present invention may thus reduce power in a memory device by preventing a row of memory cells from unnecessarily drawing unused and/or unusable current.

23 Claims, 9 Drawing Sheets

BLOCK ARCHITECTURE SEMICONDUCTOR MEMORY ARRAY UTILIZING NON-INVERTING PASS GATE LOCAL WORDLINE DRIVER

BACKGROUND OF THE INVENTION

1. Field of the Invention

This invention relates to block architecture memory arrays, and more particularly to a non-inverting pass gate local wordline driver which is utilized in block architecture memory arrays.

2. Discussion of Background

Static random access memories (SRAMs) are conventionally used in applications which require data to be stored and retrieved, typically in a high speed environment such as personal computers and modems. All address locations in an SRAM can be accessed randomly and the SRAM will retain data as long as power is supplied to the device.

FIG. 1 illustrates a block diagram of a generic 256K SRAM chip, including a total of (256×1024) memory cells on the chip for storing 256K bits of data. The bits are organized into eight bit words ($I/O_0$=$I/O_7$), hence the device architecture is referred to as 32K×8. Each of the eight I/Os can access 32K locations, which are selected by the 15 addresses (A0–A14). Three control signals govern the operation of the chip ($\overline{CE}$, $\overline{WE}$, and $\overline{OE}$).

In a typical application, such as in a personal computer, a microprocessor provides to the SRAM chip eight data bits representing either data stored in the SRAM which is to be read out therefrom or data to be written to the SRAM chip. The microprocessor further provides 15 address signals (A0–A14) and three control signals ($\overline{CE}$, $\overline{WE}$, and $\overline{OE}$) to control the functioning of the SRAM. If the eight data bits are to be written into one of the 32K address locations specified by the 15 address bits, the microprocessor will provide the appropriate control signals to accomplish this task. Similarly, if the eight data bits stored at the address location specified by the 15 address bits are to be read out from the SRAM, the microprocessor will provide the appropriate control signals to accomplish this task.

FIG. 2 illustrates a block diagram of a generic SRAM memory array. The memory array includes 256K memory cells 1, 1K (1024) wordlines 2 which are selected by a row decoder (not shown), and pairs of bits lines 3 connected to each column of memory cells. The bit lines are selected by a column decoder shown in FIG. 1.

The memory cells 1 along a row of cells are "turned on" when the row decoder selects the wordline connected to the appropriate row of memory cells. When the wordline is driven HIGH, each of the cells along that wordline is activated and the data contents of each memory cell is transferred to the respective bit lines 3. The bit lines are shared with corresponding memory cells in different rows, but only one cell can transfer its data to the bit lines at a given time. The column decoder then selects which eight of the 256 cells in the row will transfer their data to the outputs of the chip ($I/O_0$–$I/O_7$).

This type of memory architecture, which is referred to as continuous array architecture, is not in common practice today. Continuous array architecture and its associated read/write scheme may be considered inefficient because only a small number of cells (ideally only eight) need to be "on" at any given time and turning on all the memory cells of a given row draws unnecessary current which increases power consumption.

Most SRAM designs in practice utilize a different type of architecture, referred to commonly as block architecture, in which only a subset (or block) of memory cells are turned on at a time. This architecture offers substantial power savings and increased speed. FIG. 3 illustrates a typical block architecture memory array split into two blocks represented by Block0 and Block1. Each block includes 128K memory cells 4, pairs of bit lines 5 connected to each column of memory cells which are selected by a column decoder (not shown), 1024 global wordlines ($\overline{GWL}$) 6 which are selected by a row decoder (not shown), groups of 1024 local wordlines 7, and a local wordline driver WLD for each local wordline in the block. Although only one group of local wordlines is illustrated for Block0 (Local WL<1a>–Local WL<1024a>) and for Block1 (Local WL<1b>–Local WL<1024b>), it is to be understood that multiple local wordlines exist in each block such that each global wordline is associated with one or a plurality of local wordlines.

In operation, a block of memory cells is activated by asserting the appropriate block signal (BLOCK0 or BLOCK1). The block signal combines with a selected global wordline within the selected block to activate a local wordline and the memory cells connected thereto. The BLOCK0 and BLOCK1 signals are active-high signals (i.e., the signals are active at a HIGH logic level), and the global wordlines ($\overline{GWL}$) 6 are active-low. A local wordline will be activated only when both the appropriate block signal and the corresponding global wordline are active (i.e., BLOCK is HIGH and ($\overline{GWL}$) is LOW).

The local wordlines are shorter than the global wordlines and are connected to fewer memory cells. Thus, when a global wordline is selected, a local wordline is activated such that only a fraction of the memory cells in a given row are "turned on" rather than the entire row of memory cells. Less current is drawn and power consumption is thereby decreased. In practice, most block architecture designs extend the concept illustrated in FIG. 3 such that a memory array is partitioned into, for example, 16, 32, or 64 blocks.

Generic SRAM construction and operation is further described in the *Cypress Semiconductor High Performance Data Book*, Pages 2-1 through 2-292, which is incorporated herein by reference.

The above-described block architecture, however, has several drawbacks. It is common for a block architecture array to be designed such that the global wordline is an active-low signal; that is, all of the "off" global wordlines are held at a logic HIGH level while the selected global wordline is pulled down to a logic LOW level. Consequently, the local wordline is usually designed to be an active-high signal so that when a global wordline goes active (LOW) and the block address is asserted, a local wordline is pulled HIGH, thus turning on the memory cells located along that local wordline.

A typical silicon layout of this type of block architecture memory array usually places the local and global wordlines in close proximity to one another in the same metal layer. If a particle or other defect forms a short between the local and global wordlines, a problem exists that while the global wordline can be permanently disabled (pulled HIGH) and replaced using a redundant element, the corresponding local wordline is pulled HIGH through the short and the memory cells along that local wordline will always be "on" and drawing current.

This situation is illustrated in FIG. 4, where the global wordline 8 is shorted to the local wordline 9 via the metal short 10 which causes the off (HIGH) global wordline to pull up and turn on the local wordline despite the inverting logic gate 11 which attempts to pull the local wordline LOW. Such a conventional inverting local wordline driver is therefore not acceptable.

Other commonly used local wordline driver circuits are illustrated in FIGS. 5–7. FIG. 5 illustrates a power-decoded NOR circuit 18 employed as a local wordline driver, similar to the decoding buffer gate disclosed in U.S. Pat. N. 4,344,005. FIG. 6 illustrates a standard NOR circuit 19 employed as the local wordline driver. In both figures, the polarity of the local wordlines (LWL) 12, 14 is different from the polarity of the inverted global wordlines ($\overline{GWL}$) 13, 15. In this case, the local wordline is pulled HIGH when the inverted global wordline is active-low (and the appropriate block signals are asserted). This situation is disadvantageous when metal-to-metal shorts exist that short circuit the local wordline to the global wordline. When this occurs, an inactive local wordline can be falsely pulled HIGH (on) through the short or its corresponding inverted global wordline which is HIGH (off).

The local wordline driver scheme of FIG. 7 remedies this drawback by maintaining the local wordline (LWL) 16 and global wordline (GWL) 17 at the same polarity, however this circuit, which employs a NAND-invert circuit as the local wordline driver, requires many transistors and therefore may be undesirably large and complex.

SUMMARY OF THE INVENTION

Accordingly, an object of this invention is to provide a novel non-inverting pass gate local wordline driver for block architecture memory arrays which remedies the above-stated drawbacks using fewer transistors and requiring less space.

This and other objects are achieved according to the present invention by providing a local wordline driver in which the polarity of the global wordline is reversed to be active-high. If a particle or defect short circuits a local wordline and its corresponding global wordline, the global wordline can be permanently disabled by pulling it LOW which will also permanently disable the local wordline so that unnecessary current is not drawn.

The present invention provides a non-inverting pass gate local wordline driver for selectively driving an output line in response to an inactive-low input signal, the driver including (1) a pass gate circuit configured to either (a) pass the input signal from the input line to the output line or (b) block the input signal, and (2) a clamp circuit configured to clamp the output line to a low logic level whenever the pass gate circuit blocks the input signal.

The pass gate circuit may include a first switch having a control terminal connectable to a first control signal having a first polarity, an input terminal connectable to the input line, and an output terminal connectable to the output line, the first switch becoming conductive when the control signal changes from the first polarity to a second polarity opposite to the first polarity, and a second switch having a control terminal connectable to a second control signal having the second polarity, an input terminal connectable to the input line, and an output terminal connectable to the output line, the second switch becoming conductive when the second control signal changes polarity from the second polarity to the first polarity.

The clamp circuit may include a third switch having a control terminal connectable to the control terminal of the second switch, an output terminal connectable to a supply potential at the first polarity, and an input terminal connectable to the output terminals of the first and second switches and to the output line.

According to one embodiment of the invention, the inactive-low input signal is applied to an input line, the input line may be a global wordline, the output line may be a local wordline, the first control signal may be a BLOCK signal, and the second control signal may be a $\overline{BLOCK}$ signal having a polarity opposite to the BLOCK signal.

According to another embodiment of the invention, the input line may provide a BLOCK signal, the output line may be a local wordline, the first control signal may be a global wordline having a first polarity, and the second control signal may be an inverse global wordline having a second polarity opposite to the first polarity.

The pass gate circuit may include only the first switch having a control terminal connectable to a first control signal having a first polarity, an input terminal connectable to the input line, and an output terminal connectable to the output line, the first switch becoming conductive when the control signal changes from the first polarity to a second polarity opposite to the first polarity.

According to another embodiment of the invention, the inactive-low input signal is applied to an input line, the input line may be a global wordline, the output line may be a local wordline, the first control signal may be a BLOCK signal, and a $\overline{BLOCK}$ signal may be applied to the control terminal of the third switch.

According to another embodiment of the invention, the input line may provide a BLOCK signal, the output line may be a local wordline, the first control signal may be a global wordline having a first polarity, and an inverse global wordline having a second polarity opposite to the first polarity may be connectable to the control terminal of the third switch.

In each of these embodiments, a metal short caused by a particle or defect will not pull up the local wordline when the global wordline is LOW so that unnecessary and/or unusable current is not drawn by the shorted wordlines.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings wherein.

DESCRIPTION OF THE PREFERRED EMBODIMENTS

Figure 1:
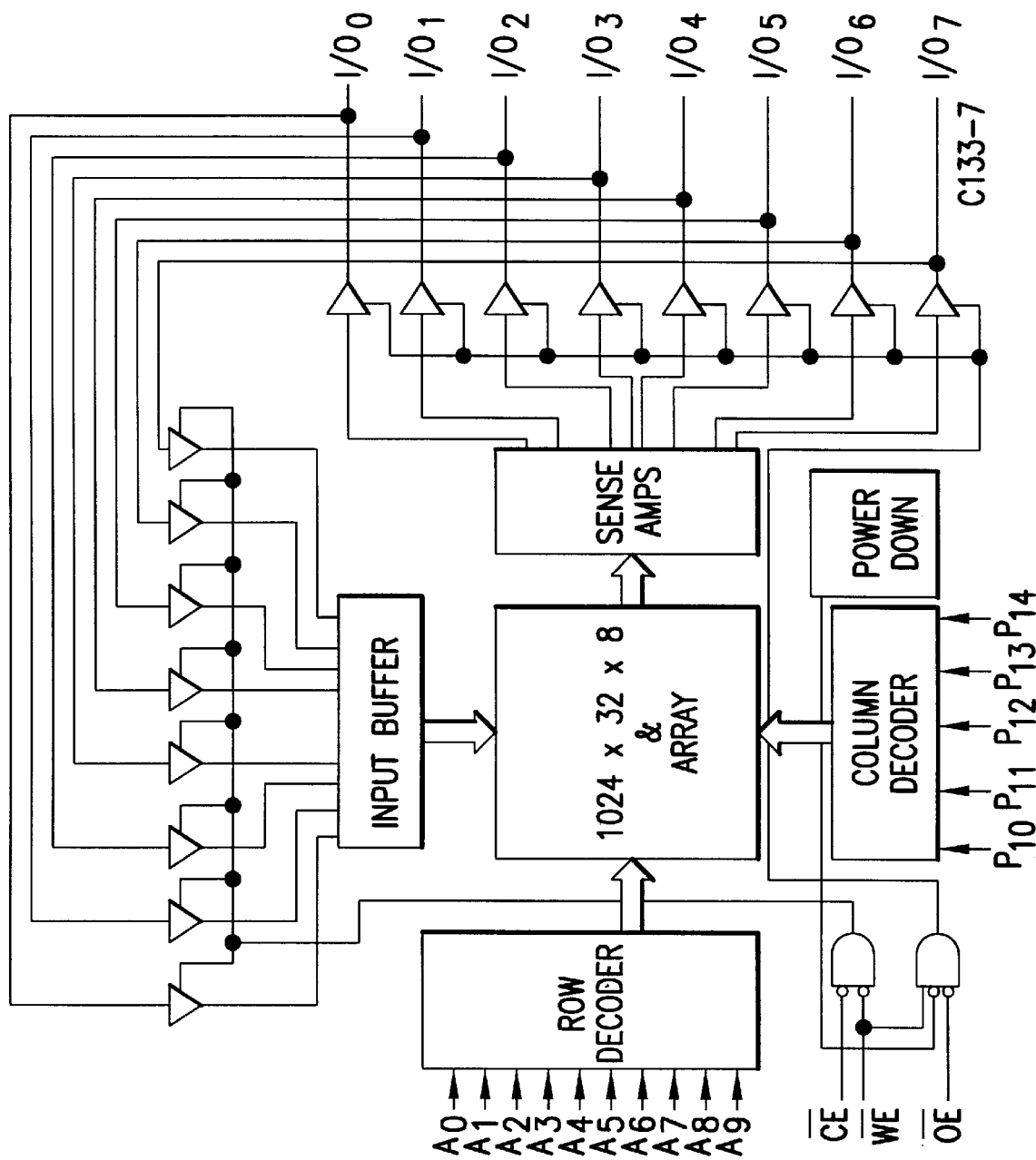
FIG. 1 is a block diagram of a generic static random access memory (SRAM)
Figure 2:
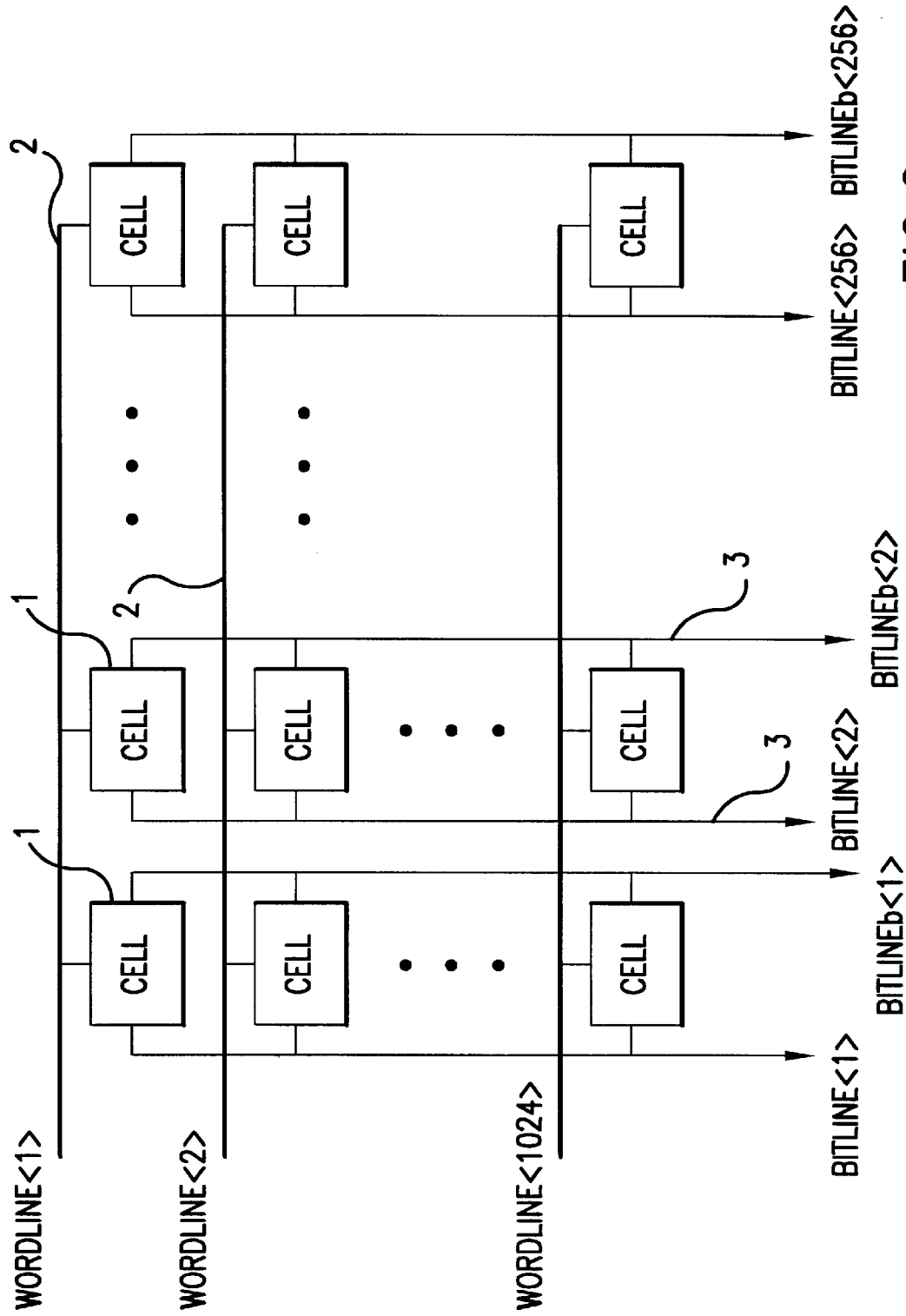
FIG. 2 illustrates conventional continuous array memory architecture.
Figure 3:
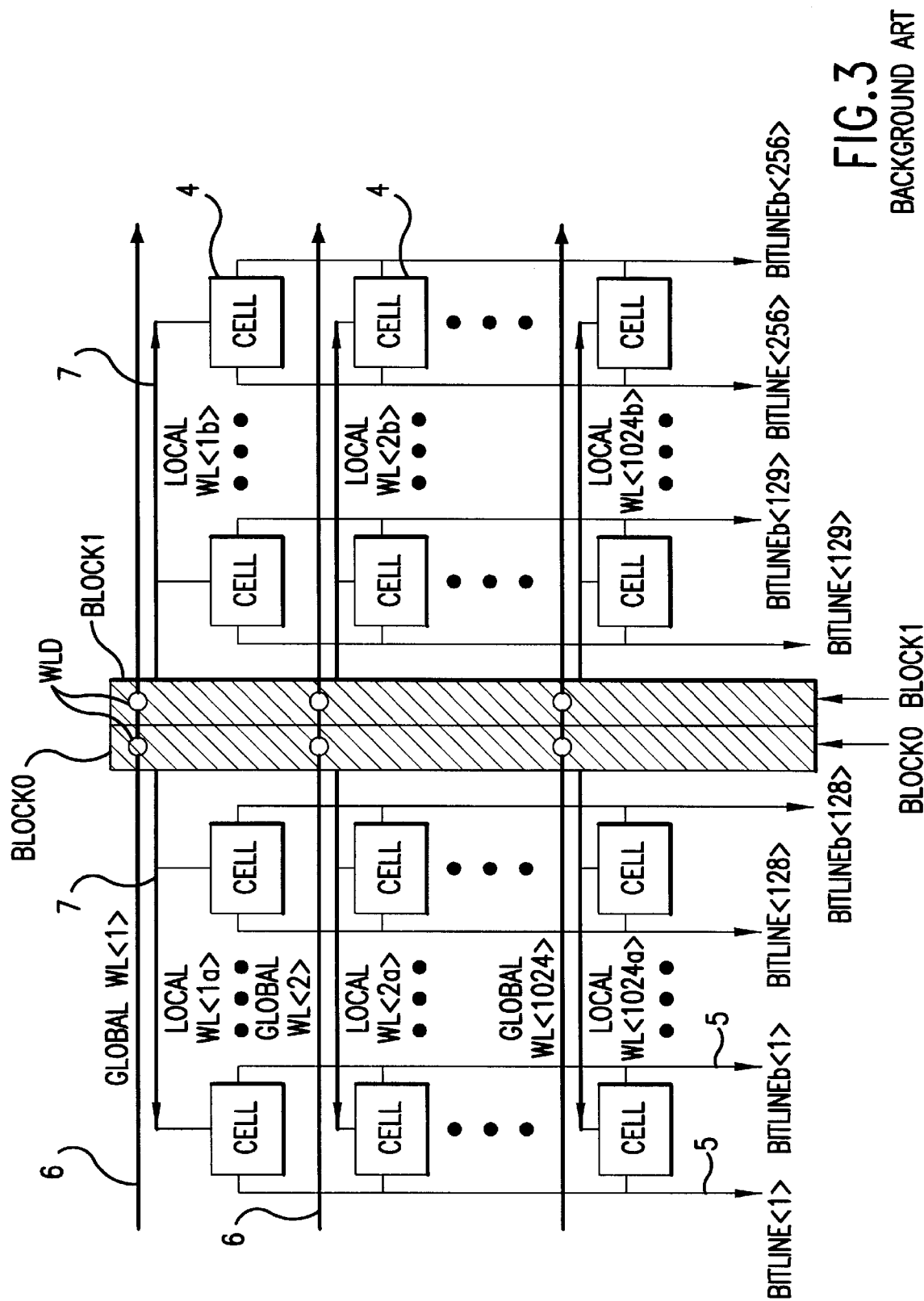
FIG. 3 illustrates a conventional block architecture memory array.
Figure 4:
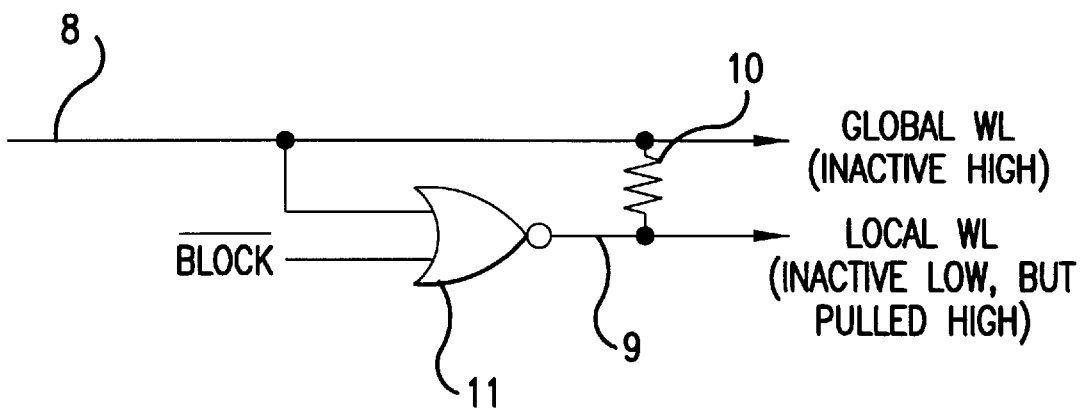
FIGS. 4–7 illustrate conventional local wordline driver circuits.
Figure 5:
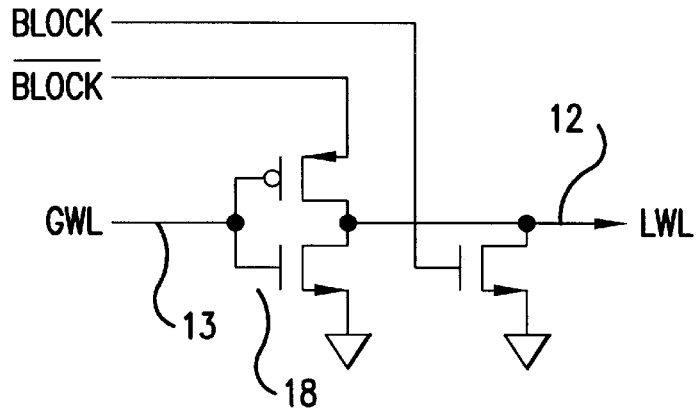
Figure 6:
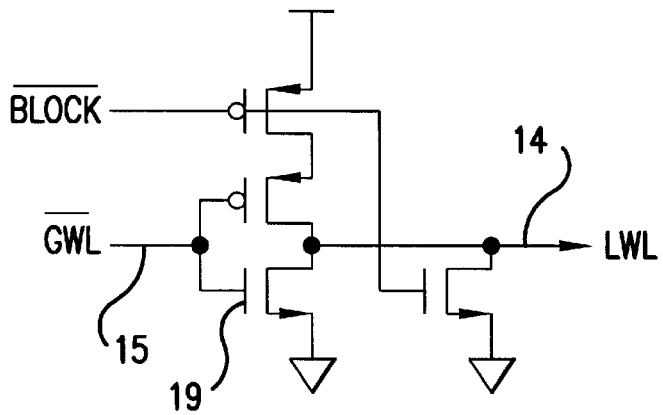
Figure 7:
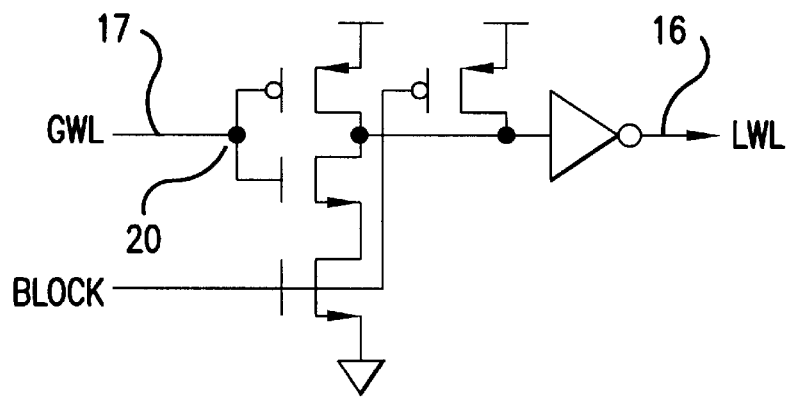
Figure 8:
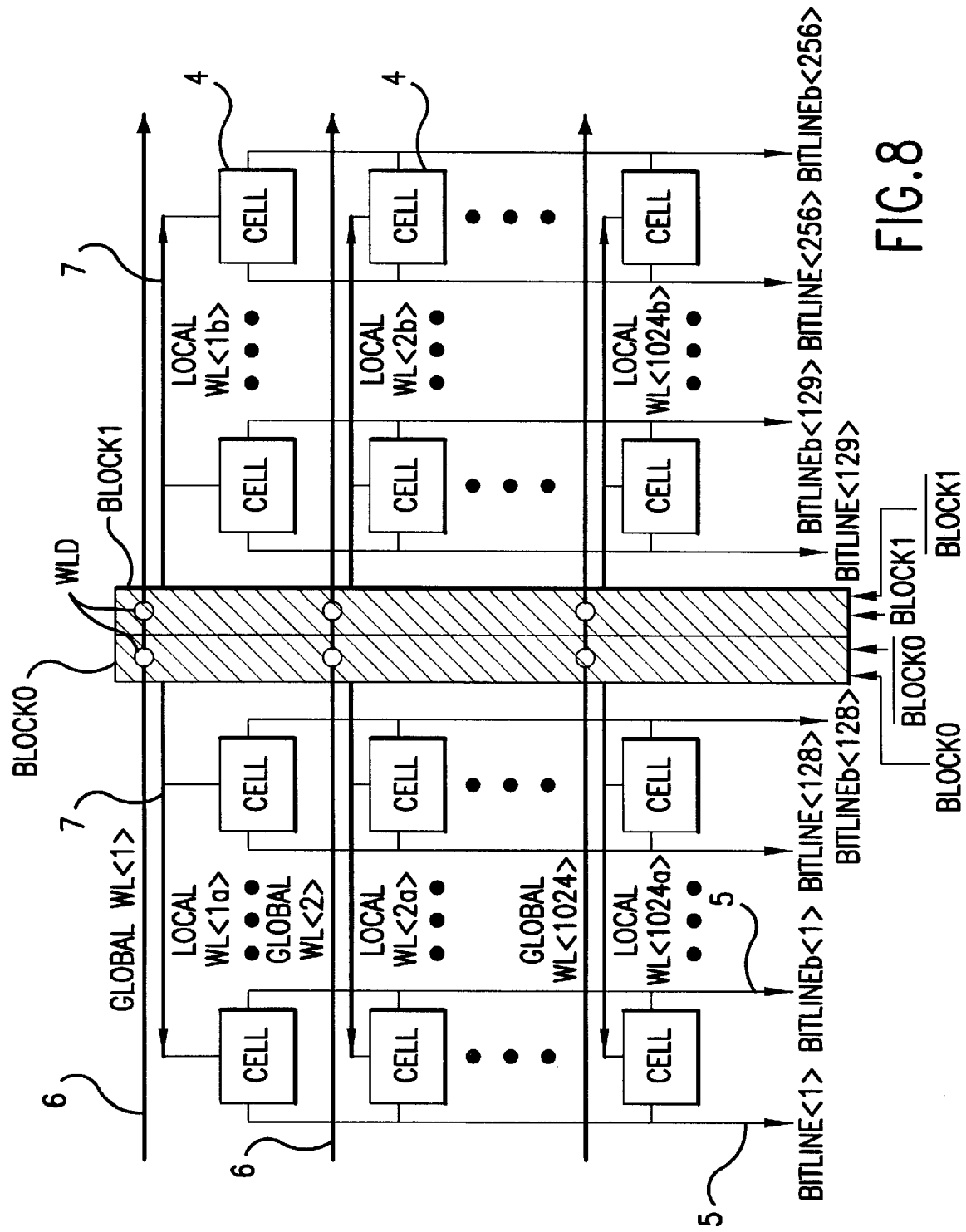
FIG. 8 illustrates a block architecture memory array according to one embodiment of the present invention.

Referring now to the drawings, wherein like reference numerals designate identical or corresponding parts throughout the several views, and more particularly to FIG. 8 thereof, the invention may be implemented in a block architecture memory array similar to the memory array of FIG. 3 and may further include active-low $\overline{\text{BLOCK}}$ signals and active-high global wordlines 6a.

Figure 9:
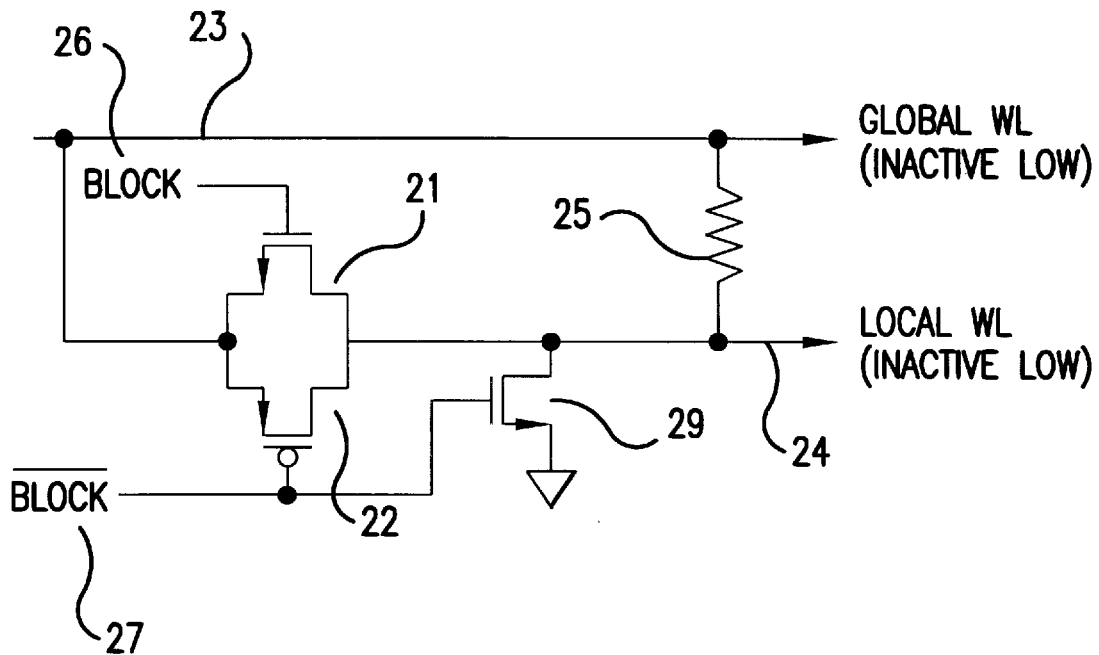
FIGS. 9–10 illustrate non-inverting pass gate local wordline drivers for the memory array of FIG. 8.

Referring to the embodiment illustrated in FIG. 9, each word line driver WLD of FIG. 8 includes a non-inverting pass gate including an N-channel MOS transistor 21 connected to a P-channel MOS transistor 22 such that the respective drains and sources of the transistors are connected together. A global wordline (GWL) 23 is connected to one of the source/drain terminals of the transistors. A local wordline (LWL) 24 is connected to the other of the source/drain terminals of the transistors and to the drain of N-channel MOS transistor 29. The source of N-channel MOS transistor 29 may be grounded. A BLOCK signal 26 may be supplied to the gate of the N-channel MOS transistor 21 and an inverted block signal $\overline{\text{BLOCK}}$ 27 may be supplied both to the gate of the P-channel MOS transistor 22 and to the gate of the N-channel MOS transistor 29.

When a particle or defect creates a short 25 which short circuits a local wordline to a global wordline, the global wordline may be permanently disabled by pulling it LOW. Regardless of the states and/or polarities of the BLOCK and $\overline{\text{BLOCK}}$ signals, the local wordline is permanently held LOW because the pass gate is non-inverting. In the case where the pass gate is non-conducting, the N-channel MOS transistor 29 clamps the local wordline 24 to a LOW logic level to prevent the local wordline from being enabled and turning on a row of memory cells which will unnecessarily draw unused and/or unusable current. In the case where the pass gate is conducting, the global wordline is held LOW thereby holding the local wordline LOW.

An example of a test for determining when to drive the global wordline LOW is to test the part (e.g., memory device) row-by-row (e.g., using a software program and/or conventional memory test circuitry). If a high current state is detected, then the global wordline is pulled LOW. The global wordline can be permanently pulled LOW and replaced using conventional redundancy technologies.

Figure 10:
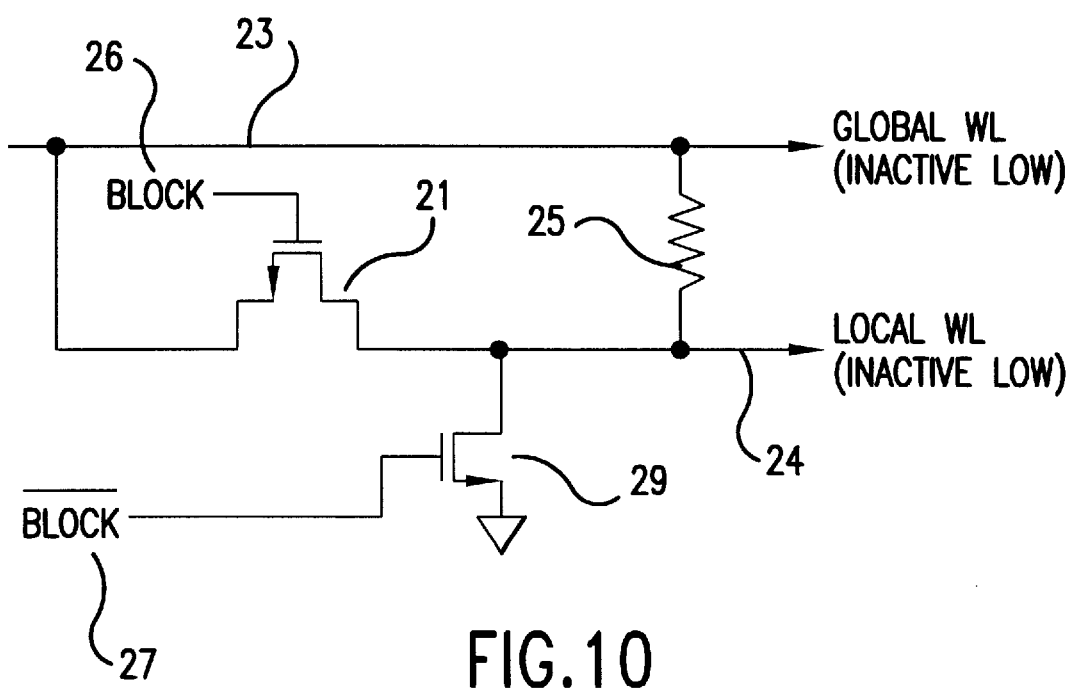

Another embodiment of a wordline driver usable in conjunction with the memory array of FIG. 8 is illustrated in FIG. 10. This embodiment is identical to the embodiment of FIG. 9 with the P-channel MOS transistor 22 removed. N-channel transistor 21 acts as the pass gate by becoming conducting when the BLOCK signal is HIGH and becoming non-conductive when the BLOCK signal is LOW. N-channel transistor 29 clamps the local wordline 24 to a LOW logic level when the pass gate 21 is non-conductive and blocks the input signal. A short circuit 25 thus cannot pull up the local wordline 24 when the global wordline 23 has been disabled.

Figure 11:
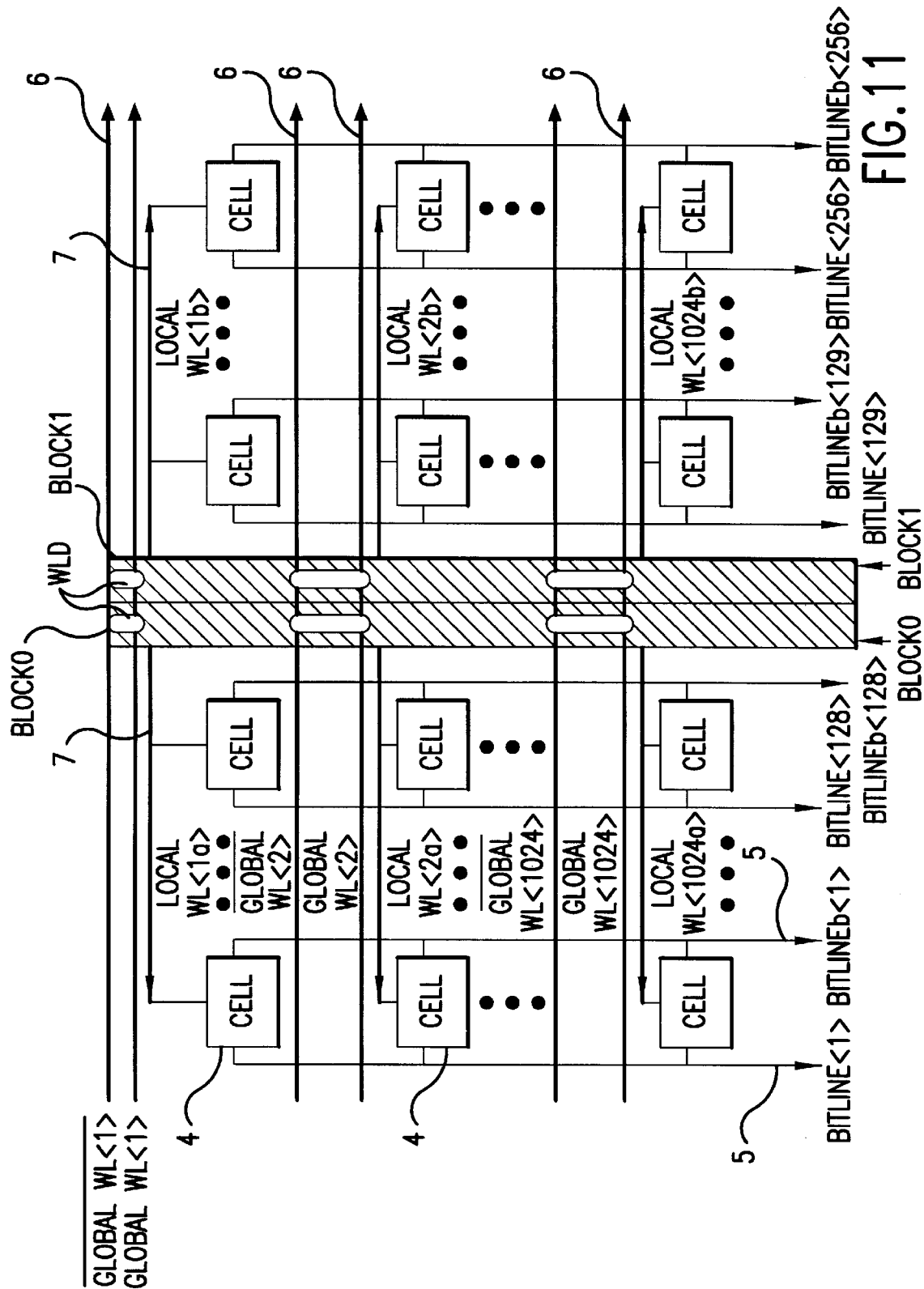
FIG. 11 illustrates a block architecture memory array according to another embodiment of the present invention.

The invention may also be implemented in the block architecture memory array of FIG. 11, which is similar to the memory array of FIG. 3 and further includes active-high global wordlines 6a.

Figure 12:
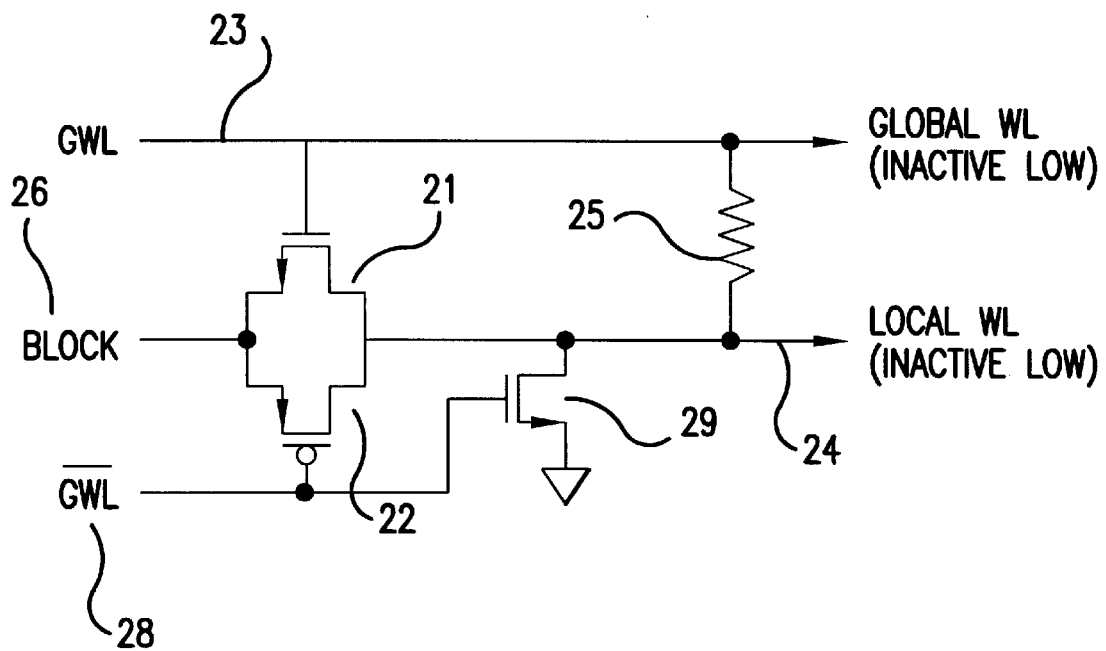
FIGS. 12–13 illustrate non-inverting pass gate local wordline drivers for the memory array of FIG. 11.

Referring to the embodiment illustrated in FIG. 12, each word line driver WLD of FIG. 11 includes a global wordline (GWL) 23 connected to the gate of the N-channel MOS transistor 21 and a local wordline (LWL) 24 connected to one of the source/drain terminals of the transistors and to the drain of the N-channel MOS transistor 29. The source of N-channel MOS transistor 29 may be grounded. As inverted global wordline ($\overline{\text{GWL}}$) 28 is, connected to the gates of the P-channel MOS transistor 22 and the N-channel MOS transistor 29. A BLOCK signal 26 may be provided to the other of the source drain terminals of the N-channel MOS transistor 21 and P-channel MOS transistor 22.

Similar to the embodiments described above, in this embodiment the local wordline 24 will be permanently disabled if the global wordline 23 is permanently disabled due to a particle or defect which creates a short circuit between the global wordline and the local wordline.

Figure 13:
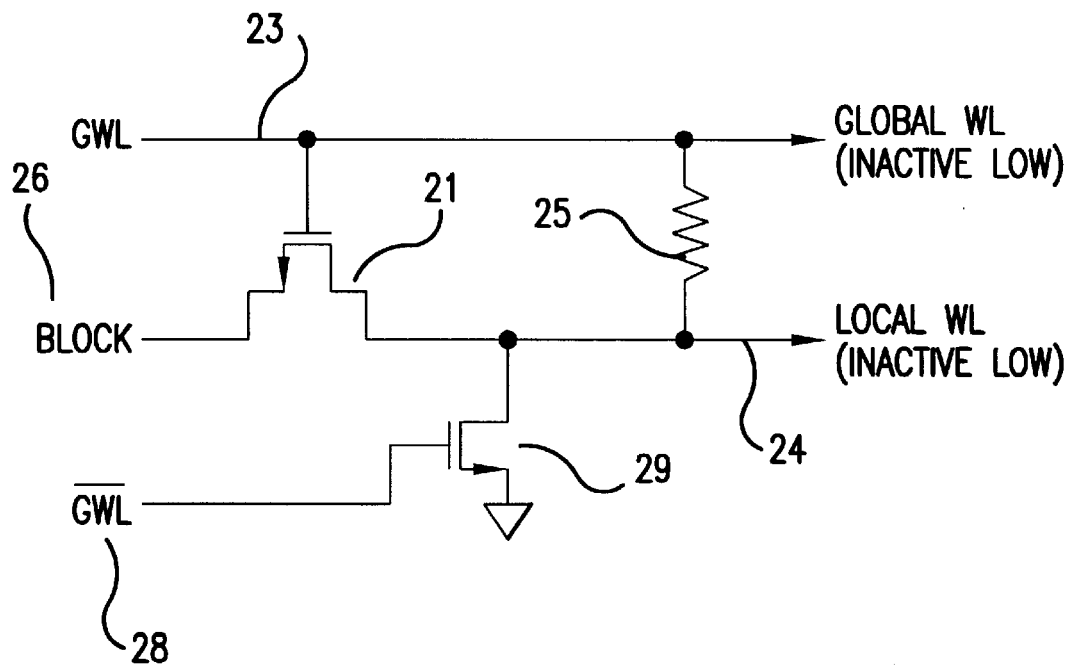

Another embodiment of a wordline driver in conjunction with the memory array of FIG. 11 is illustrated in FIG. 13. This embodiment is identical to the embodiment of FIG. 12 with the P-channel MOS transistor 22 removed. N-channel transistor 21 acts as the pass gate by becoming conducting when the GWL signal is HIGH and becoming non-conductive when the GWL signal is LOW. N-channel transistor 29 clamps the local wordline 24 to a LOW logic level when the pass gate 21 is non-conductive and blocks the input signal. A short circuit 25 thus cannot pull up the local wordline 24 when the global wordline 23 has been disabled.

The logic and/or programming aspects of the present invention, including the programming of the BLOCK and GWL signals, may be conveniently implemented using a conventional general purpose digital computer programmed according to the teachings of the present disclosure, as will be apparent to those skilled in the relevant arts. Appropriate software coding can readily be prepared by skilled programmers based on the teachings of the present disclosure, as will be apparent to those skilled in the relevant arts.

The present invention may also be implemented by the preparation of application specific integrated circuits or by interconnecting an appropriate network of conventional component circuits as described herein, modifications of which will be readily apparent to those skilled in the relevant arts.

The present invention thus also includes a computer program product which may comprise a storage medium including instructions which can be used to program a computer to perform a process according to the present invention. The storage medium can include, but is not limited to, any type of disk including magnetic floppy disks, optical disks, CD-ROMs, and magneto-optical disks, ROMs, RAMs, EPROMs, EEPROMs, magnetic or optical cards, or any type of media suitable for storing electronic instructions.

Obviously, numerous modifications and variations of the present invention are possible in light of the above teachings. For example, while the embodiments disclosed employ PMOS and NMOS switches, other types of transistors and/or switches are possible. It is therefore to be understood that within the scope of the appended claims, the invention may be practiced otherwise than as specifically described therein.

What is claimed as new and desired to be secured by Letters Patent of the United States is:

1. A memory array, comprising:
   a global wordline;
   a plurality of local wordlines, each coupled to a plurality of memory cells,
   a plurality of pass gate circuits, each receiving an input signal from said global wordline, configured to either (i) pass said input signal to a unique one of said local wordlines or (ii) block said input signal in response to a control signal; and
   a plurality of clamp circuits configured to clamp said unique one of said local wordlines to a predetermined logic level whenever the corresponding pass gate circuit blocks said input signal.

2. A memory array according to claim 1, wherein said pass gate circuit comprises:
- a first switch having a control terminal connectable to said control signal, an input terminal connectable to said said global wordline, and an output terminal connectable to said unique one of said local wordlines, said first switch becoming conductive when said control signal changes from a first polarity to a second polarity opposite to said first polarity; and
- a second switch having a control terminal connectable to a second control signal having said second polarity, an input terminal connectable to said said global wordline, and an output terminal connectable to said unique one of said local wordlines, said second switch becoming conductive when said second control signal changes polarity from said second polarity to said first polarity.

3. A memory array according to claim 2, wherein said clamp circuit comprises:
- a third switch having a control terminal connectable to the control terminal of said second switch, an output terminal connectable to a supply potential at said first polarity, and an input terminal connectable to the output terminals of said first and second switches and to said output line.

4. A memory array according to claim 3, wherein said first and third switches are N-channel MOS transistors and said second switch is a P-channel MOS transistor.

5. A memory array according to claim 1, wherein said pass gate circuit comprises:
- a first switch having a control terminal connectable to a first control signal, an input terminal connectable to said said global wordline, and an output terminal connectable to said unique one of said local wordlines, said first switch becoming conductive when said first control signal changes from said first polarity to a second polarity opposite to said first polarity.

6. A memory array according to claim 5, wherein said clamp circuit comprises:
- a second switch having a control terminal connectable to a second control signal having said second polarity, an output terminal connectable to a supply potential at said first polarity, and an input terminal connectable to the output terminal of said first switch and to said output line.

7. A memory array according to claim 6, wherein said first and second switches are N-channel MOS transistors.

8. The memory array of claim 1, wherein said memory cells comprise static random access memory cells.

9. The memory array of claim 1, wherein said global wordline and each of said local wordlines have an active-low state and an inactive-high state.

10. The memory array of claim 9, wherein said predetermined logic level is a low logic level.

11. The memory array of claim 1, wherein said predetermined logic level is a low logic level.

12. A memory array, comprising:
- a global wordline;
- a local wordline coupled to a plurality of memory cells;
- a pass gate circuit configured to either (i) pass a control signal to said local wordline or (ii) block said control signal in response to a global wordline signal; and
- a clamp circuit configured to clamp said local wordline to a predetermined logic level whenever the pass gate circuit blocks said control signal.

13. The memory array of claim 12, wherein said global wordline and each of said local wordlines have an active-low state and an inactive-high state.

14. The memory array of claim 13, wherein said predetermined logic level is a low logic level.

15. The memory array of claim 12, comprising a plurality of said local wordlines, a plurality of said pass gate circuits and a plurality of said clamp circuits, wherein each of said pass gate circuits couples a unique one of said local wordlines to a corresponding control signal.

16. The memory array of claim 12, wherein said global wordline comprises a true global wordline and a complementary global wordline, wherein:
- a signal on said complementary global wordline is complementary to a signal on said true global wordline; and
- said pass gate circuit blocks said control signal in response to said signal on said complementary global wordline.

17. The memory array of claim 16, wherein said clamp circuit clamps said local wordline to a low logic level whenever the pass gate circuit blocks said control signal.

18. A memory of reducing current consumption in a memory, comprising the steps of:
- testing a global wordline for a high current state;
- deactivating a pass gate circuit configured to either (i) pass an input signal to a local wordline or (ii) block said input signal in response to detecting said high current state, said local wordline coupled to said global wordline through said pass gate circuit; and
- in response to deactivating said pass gate circuit, clamping said local wordline to a low logic level.

19. The method of claim 18, wherein said deactivating step comprises the steps of:
- activating a control signal in response to positively identifying said global wordline; and
- deactivating said pass gate in response to said control signal.

20. The method of claim 19, wherein said input signal is a global wordline signal, and said pass gate blocks said global wordline signal in response to said control signal.

21. The method of claim 18, wherein said pass gate couples said global wordline to said local wordline.

22. The method of claim 18, wherein said input signal is a control signal, and said pass gate blocks said global wordline signal in response to a global wordline signal.

23. The method of claim 22, wherein said pass gate couples said global wordline to said local wordline.

* * * * *